United States Patent [19]
Sasaki

[11] Patent Number: 5,227,327
[45] Date of Patent: Jul. 13, 1993

[54] METHOD FOR MAKING HIGH IMPEDANCE PULL-UP AND PULL-DOWN INPUT PROTECTION RESISTORS FOR ACTIVE INTEGRATED CIRCUITS

[75] Inventor: Minoru Sasaki, Suwa, Japan

[73] Assignee: Seiko Epson Corporation, Tokyo, Japan

[21] Appl. No.: 819,253

[22] Filed: Jan. 10, 1992

Related U.S. Application Data

[62] Division of Ser. No. 610,620, Nov. 8, 1990, Pat. No. 5,121,179.

[30] Foreign Application Priority Data

Nov. 10, 1989 [JP] Japan .................................. 1-292627
Oct. 8, 1990 [JP] Japan .................................. 2-271555

[51] Int. Cl.$^5$ .................... H01L 21/70; H01L 27/00
[52] U.S. Cl. ...................................... 437/60; 257/536
[58] Field of Search ................ 437/60; 357/23.13, 42, 357/59 F

[56] References Cited

U.S. PATENT DOCUMENTS

| | | | |
|---|---|---|---|
| 4,189,739 | 2/1980 | Copeland, III | 357/41 |
| 4,830,976 | 5/1989 | Morris et al. | 437/47 |
| 4,893,159 | 1/1990 | Suzuki et al. | 357/41 |

FOREIGN PATENT DOCUMENTS

| | | |
|---|---|---|
| 61656 | 4/1983 | Japan . |
| 2152283 | 7/1985 | United Kingdom . |

Primary Examiner—Olik Chaudhuri
Assistant Examiner—Long Pham
Attorney, Agent, or Firm—Harold T. Tsiang

[57] ABSTRACT

An integrated circuit having MIS transistors pull-up and pull-down gate input resistors of a sufficient high resistance. The high resistance values are obtained in spite of using self-aligned refractory metal silicide films by redefining available channel stoppers to form the respective first terminals of the resistors and a contact region in a lightly doped substrate or well region to form the respective second terminals of the resistors.

16 Claims, 5 Drawing Sheets

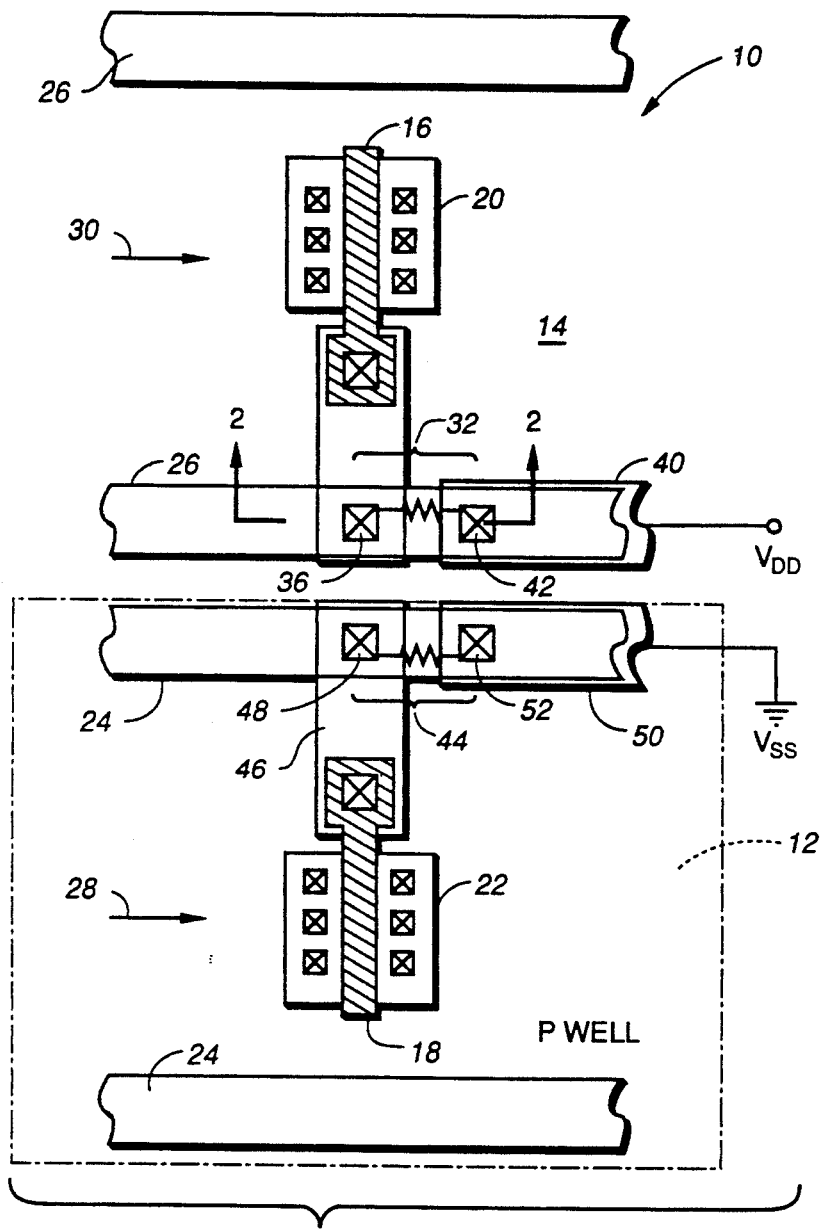
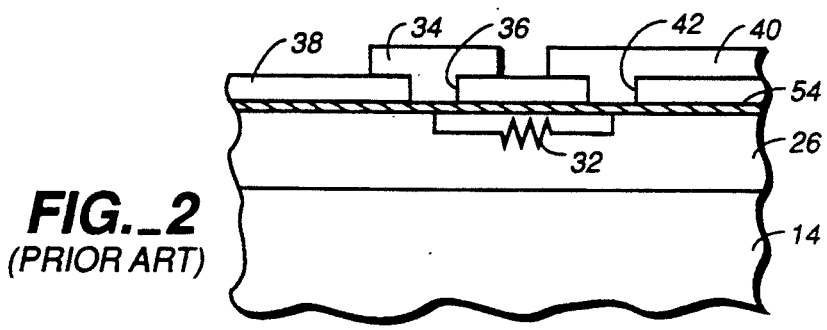
FIG._1A (PRIOR ART)
FIG._1B (PRIOR ART)
FIG._1C (PRIOR ART)
FIG._2 (PRIOR ART)

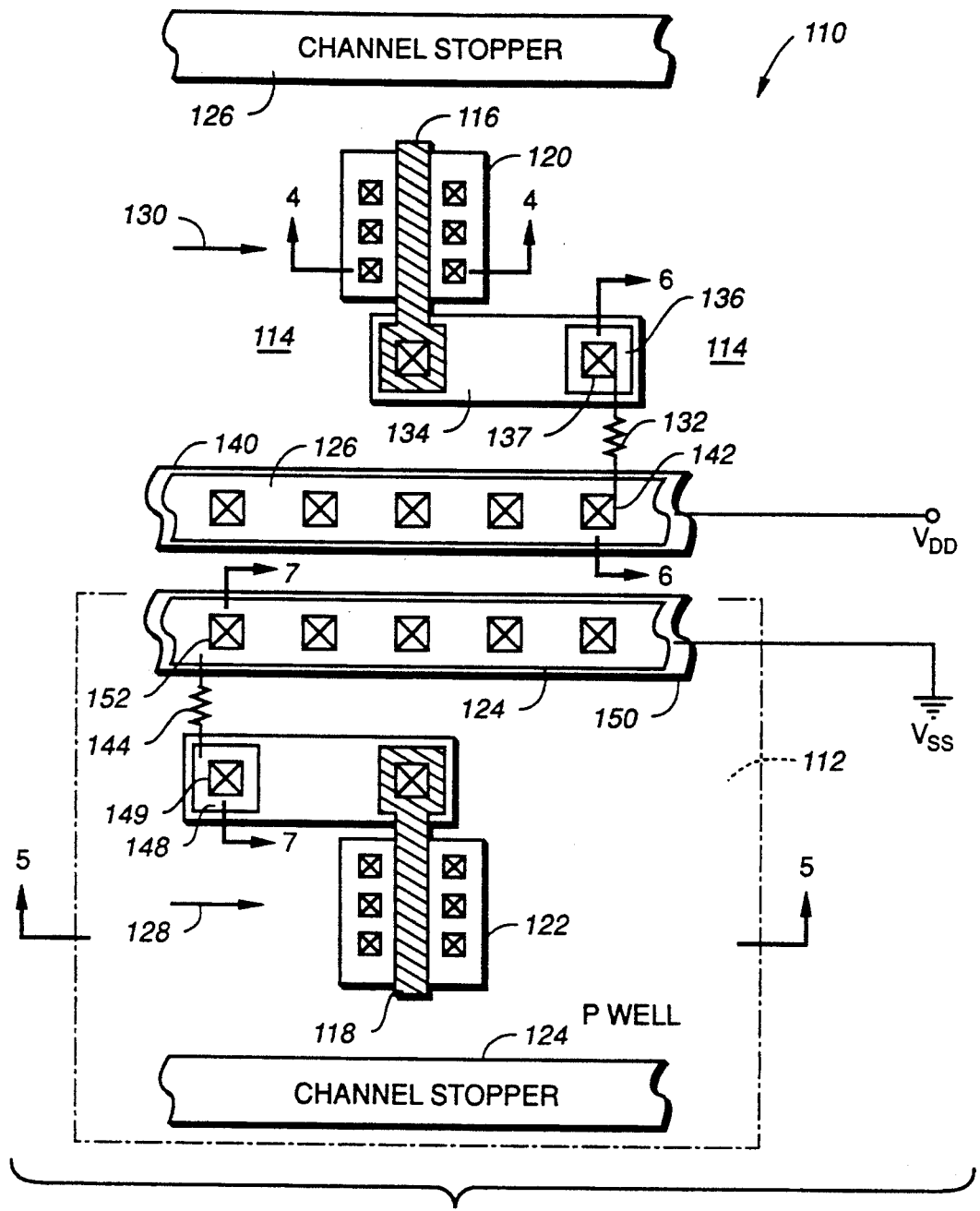
FIG._3A
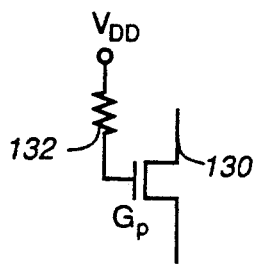
FIG._3B
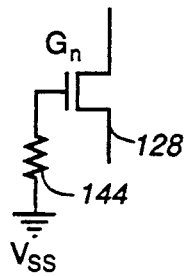
FIG._3C

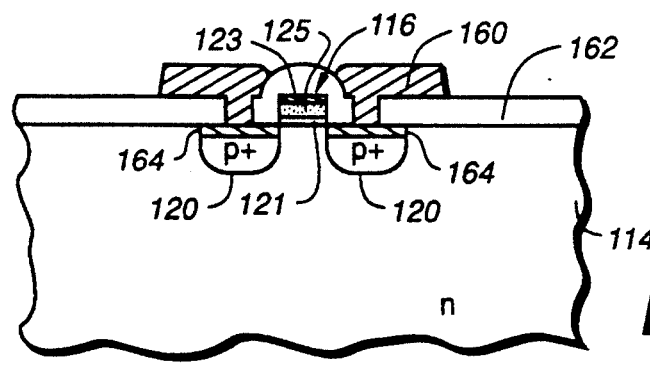
FIG._4
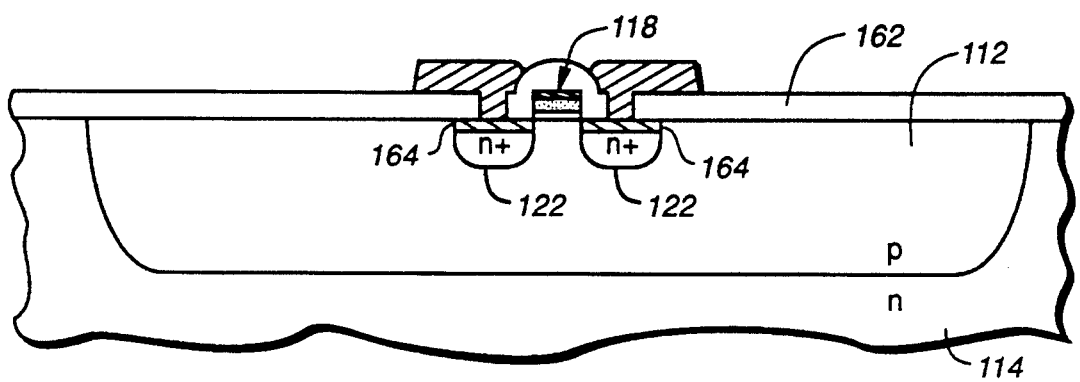
FIG._5
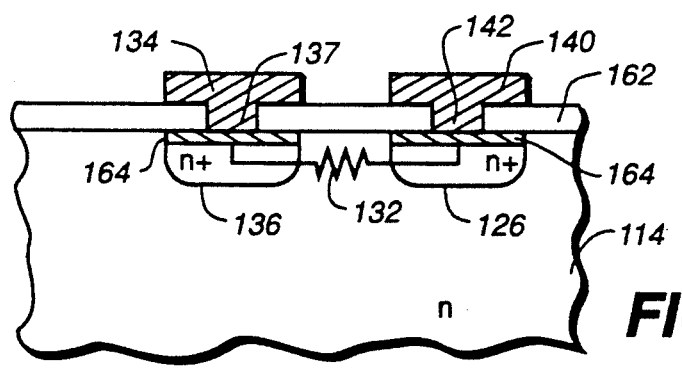
FIG._6
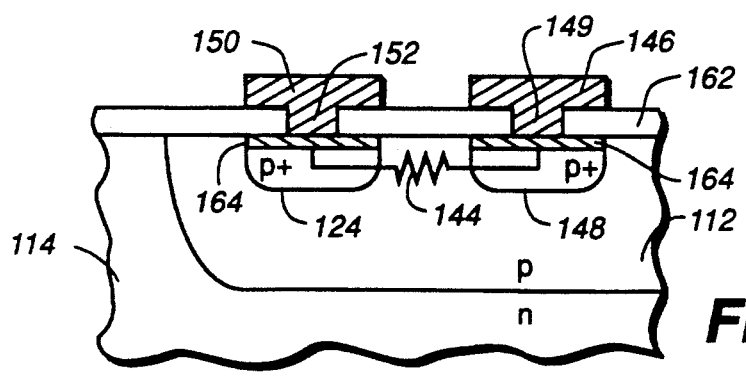
FIG._7

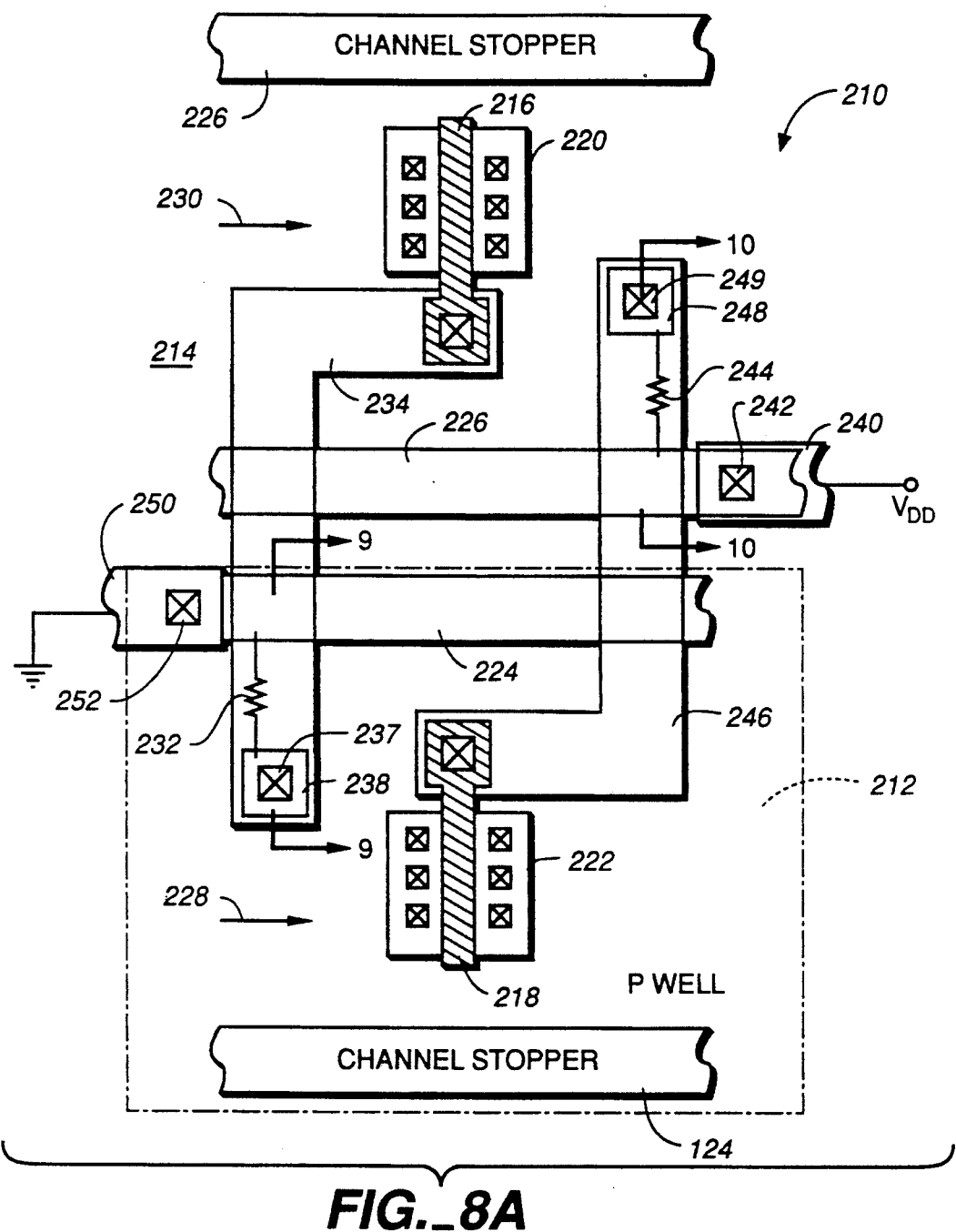
FIG._8A
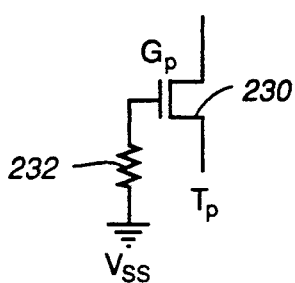
FIG._8B
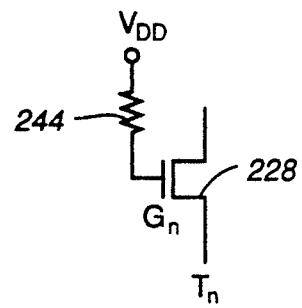
FIG._8C

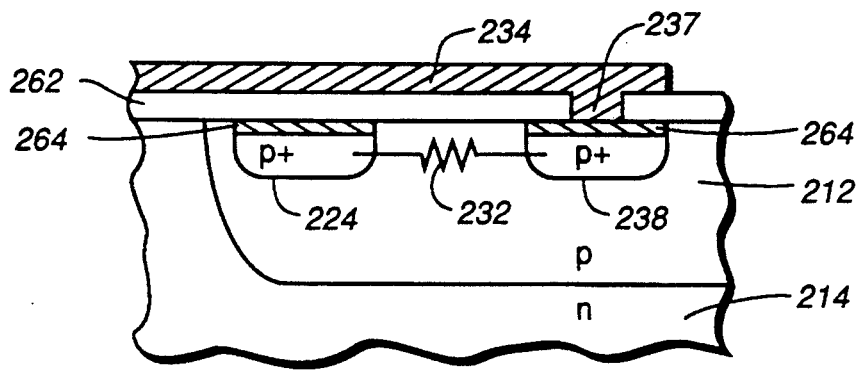
FIG._9
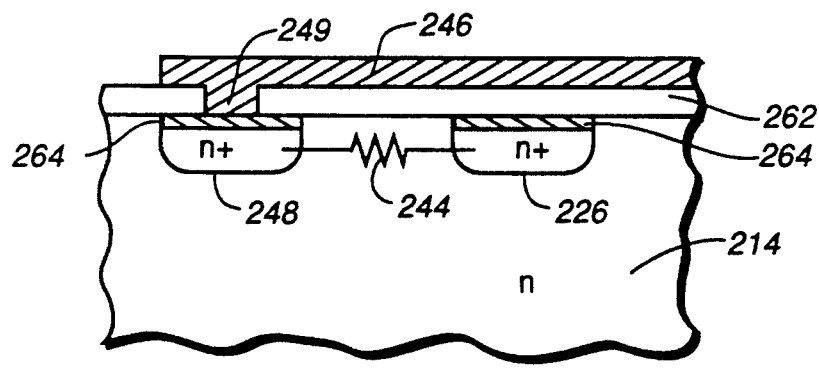
FIG._10

METHOD FOR MAKING HIGH IMPEDANCE PULL-UP AND PULL-DOWN INPUT PROTECTION RESISTORS FOR ACTIVE INTEGRATED CIRCUITS

This is a division of application Ser. No. 07/610,620 filed on Nov. 8, 1990, now U. S. Pat. No. 5,121,179.

BACKGROUND OF THE INVENTION

This invention relates generally to semiconductor integrated circuits and specifically to protecting the gate inputs of metal-insulator-semiconductor (MIS) transistors with a protective resistor connected to ground or a power supply rail, and in particular, to methods of fabricating high resistance value protective resistors when using a self-aligning silicide process.

FIG. 1 illustrates a prior art complementary insulated gate field effect MIS transistor integrated circuit (IC) 10 which is fabricated with a self-aligning silicide process. IC 10 has a p-type well 12 formed on the main surface of an n-type semiconductor substrate 14, a pair of polycide structure gate electrodes 16 and 18, a p-type source/drain region 20 and an n-type source/drain region 22. Region 20 and region 22 are self-aligned by masking the gate electrode 16 and the gate electrode 18. A pair of first type "channel stoppers" 24, which are heavily doped with p-type impurities, are formed in well 12, and are used to prevent MOS parasitics. A pair of second type channel stoppers 26, which are heavily doped with n-type impurities, are formed on substrate 14, and are used to prevent latch-up. Gate electrodes 16 and 18 each comprise a polycrystalline silicon film and a film of a refractory (high melting-point) metal disilicide, such as TiSi$_2$ (titanium disilicide), and are formed on substrate 14 and well 12 over gate insulation films. An n-channel MOS transistor 28 is formed by the gate electrode 18 and region 22 on well 12. A p-channel MOS transistor 30 is formed by the gate electrode 16 and region 20 on substrate 14. A self-aligned silicide process is used to reduce the gate resistance, the contact resistance, and the diffusion resistance. The process overlays regions 20 and 22, and channel stoppers 24 and 26, with titanium or some other refractory metal. A heat treatment is then used to alloy the refractory metal to form a metal disilicide layer.

Input impedances at the gates of MIS transistors 28 and 30 are extremely high in IC 10, due to the insulated gate construction. Unlike a bipolar transistor input, static electric charges are not readily bled off in MIS transistors without some protection means being added. Input clamping diodes are often used to prevent static and power supply glitches from destroying the input of IC 10. Without these precautions, the breakdown voltage of the gate insulation layer can easily be exceeded (thus destroying the device). Diodes are commonly used between each input and both supply rails (V$_{DD}$ and V$_{SS}$) for the clamping. Alternatively, pull-down or pull-up resistors are used on inputs to bleed-off excessive electrical charges. Transistor 30 has a pull-up resistor 32 that is connected to gate electrode 16 through an aluminum wire 34 and a contact hole 36. Resistor 32 comprises a diffusion region in a part of channel stopper 26 and is connected to V$_{DD}$ through an aluminum wire 40 and a contact hole 42. Transistor 28 has a pull-down resistor 44 that is connected to gate electrode 18 through an aluminum wire 46 and a contact hole 48. Resistor 44 comprises a diffusion region in a part of channel stopper 24 and is connected to V$_{SS}$ through an aluminum wire 50 and a contact hole 52.

FIG. 2 illustrates that channel stoppers 24 and 26 have a surface refractory metal disilicide film 54. The diffusion regions comprising resistors 32 and 44 are therefore heavily doped with impurities (similar to the concentration used in the source/drain regions) and, as such, have low bulk resistance values. This runs contrary to the goal of obtaining the higher resistance values that are preferable for pull-up and pull-down resistors (e.g., resistors 32 and 44). But limiting the high end of permissible resistor values is risk that is taken of experiencing a voltage that can break down the gate insulator film. Since the gate breakdown voltages in self-aligned silicide process gate electrodes are extremely low, the value of the resistance for resistors 32 and 44 must be set to a compromise value. Resistors 32 and 44 can be increased in value by increasing the length of the diffusion resistance region (e.g., increasing the distances between the contact holes 36 and 42, and between contact holes 52 and 48). Although this will increase the value of resistors 32 and 44, it runs counter to the very desirable aim of keeping finer features which results in much higher IC 10 packing densities.

An object of the present invention is to have a relatively large resistance value pull-up or pull-down resistor in a very small space, even when a channel stopper or other low-resistivity diffusion region formed by a self-aligned silicide process is used.

SUMMARY OF THE INVENTION

According to the present invention, an integrated circuit has the gate electrodes of its MIS transistors connected to the power supply rails or ground through resistors which protect the gates from damage due to static electricity or power supply transients. The semiconductor substrate and the well formed therein do not have a refractory metal disilicide film on their surfaces, so the impurity concentrations in the substrate and the well are low, making the bulk resistivity of the material relatively high, and better suited to the implementation of a pull-up or pull-down protection device for a MIS transitor gate. The diffusion region formed for use as an ohmic contact can also be used as the first contact diffusion region. The conventional channel stopper can also double as a contact diffusion region. The integrated circuit therefore comprises a first contact diffusion region formed within a semiconductor substrate, or within a well in the semiconductor substrate, that makes electrical contact on one side with a power supply potential, and comprises a second contact diffusion region formed within the semiconductor substrate or the well at a position apart from the first contact diffusion region that makes electrical contact on another side with a gate electrode. The region of the semiconductor substrate or well between the first and second contact diffusion regions constitutes the bulk resistance constituent of the resistor.

Since the resistance region of resistor is not formed entirely within the channel stopper (where the impurity content is relatively high) the resistance is higher for equivalent geometries. An IC that employs a self-aligned silicide process produces a channel stopper region whose bulk resistance is dramatically reduced by the refractory metal disilicide film. The present invention takes advantage of the fact that the semiconductor substrate and the well have relatively low impurity contents and are free of metal disilicide film, and therefore are suitable for fabricating protective resistors with much higher resistance values in a given space. An advantage of the present invention is that gate input protection can be included in resistor form, because reasonable values can be readily obtained in small spaces. In some cases, the prior art methods resulted in no gate input protection, which meant that IC reliability was reduced.

The preferred embodiment of a resistor is not a constrained to an island-like diffusion region, and instead comprises an unbounded subregion of the semiconductor substrate or the well. This subregion chosen can be relatively freely selected within the semiconductor substrate or the well. Narrow subregions have higher resistance values and the empty spaces sandwiched between diffusion regions can be used to advantage.

When a channel stopper is used as the first contact diffusion region, all that is necessary when using conventional structures is to form a second contact region that makes electrical contact with the gate electrode in the semiconductor substrate or the well. Since the same structure serves as both the first contact diffusion region and the channel stopper, the design constraints on the contact diffusion regions are reduced.

A further advantage of the present invention is that only mask changes are needed for full implementation and the number of processing steps over previous methods remains the same.

A further advantage of the present invention is that resistors with relatively high values can be realized. In particular, the self-aligned silicide process can be used and still provide a protective resistor which does not suffer from reduced resistance. Since realistically sized protective resistors with sufficiently large resistance values are possible, it becomes possible to use resistors to protect the gate insulation film from power supply noise, etc. Even though gate electrodes fabricated with the self-aligned silicide process have an extremely low breakdown voltage, the present invention makes it possible to build a resistance value that is sufficiently high while still protecting such a gate from breakdown.

A further advantage of the present invention is that although ICs with higher packing densities are made possible by finer component features, the reduction of component sizes has the adverse effect of reducing component current conduction capability, which, in turn, leads to decreased operating speed. ICs fabricated using the self-aligned silicide process are well suited to future needs since their lower contact resistance and diffusion resistance enable high operating speeds inspite of finer device geometries. The present invention makes it possible to realize an IC that has high resistance against breakdown from noise and surge voltages. This effect is particularly prominent when the invention is applied to microprocessors and memory devices.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIG. 1A is a top elevational view of a prior art CMOS integrated circuit having MIS transistors with pull-up and pull-down protection resistors buried in the channel stoppers. FIGS. 1B-1C are schematics of the pull-up and pull-down resistors connected the the gates of their respective MIS transistors; and FIG. 2 is a cross-sectional view of one of taken along the line 2—2 of the view of FIG. 1.

FIG. 3A is a top elevational view of a CMOS integrated circuit of the present invention having two MIS transistors of opposite conductivity types. FIGS. 3B-3C are schematics of the pull-up and pull-down resistors connected the the gates of their respective MIS transistors;

FIG. 4 is a cross-sectional view of MIS transistor 130 taken along the line 4—4 of FIG. 3;

FIG. 5 is a cross-sectional view of MIS transistor 122 and well 112 taken along the line 5—5 of FIG. 3;

FIG. 6 is a cross-sectional view of resistor 132 between the gate of MIS transistor 130 and channel stopper 126 taken along the line 6—6 of the view of FIG. 3;

FIG. 7 is a cross-sectional view of resistor 144 between the gate of MIS transistor 128 and channel stopper 124 taken along the line 7—7 of the view of FIG. 3;

FIG. 8A is a top view of an alternative embodiment of CMOS integrated circuit device 210 which has MIS transistors. FIGS. 8B-8C are schematics of the pull-down and pull-up resistors connected the the gates of their respective MIS transistors;

FIG. 9 is a cross-sectional view of device 210 taken along the line 9—9 in FIG. 8; and FIG. 10 is a cross-sectional view of device 210 taken along the line 10—10 in FIG. 8.

DESCRIPTION OF THE PREFERRED EMBODIMENTS

A first embodiment of the present invention is a semiconductor device 110 illustrated in FIGS. 3-7. FIGS. 4-7 provide key cross-sectional details of several critical structures in device 110. In FIG. 3A, device 110 is comprised of a well 112 (formed by a diffusion on the main surface of a substrate 114), a pair of gate electrodes 116 and 118 (each of which is formed on substrate 114 and on well 112, respectively, over gate insulation films 121), a p-type source/drain region 120, a region 122 (formed in a self-aligned process by masking the gate electrode 116 and the gate electrode 118), and a first pair of channel stoppers 124 (that are heavily doped with p-type impurity and formed within well 112). Channel stoppers 124 are included to prevent parasitic MOS, and are conventional. A second pair of channel stoppers 126 (also heavily doped, but with n-type impurity, are formed on substrate 114) are included to prevent latch-up. FIGS. 3B and 3C illustrate respectively the schematics of resistors 132 and 144. As shown in FIG. 4, gate electrodes 116 and 118 are formed by a self-aligned silicide process. Each of the gate electrodes 116 and 118 comprises a film of refractory metal disilicide 123, such as $TiSi_2$ (titanium disilicide), over a polycrystalline silicon film 125 and insulated by oxide layer 121. A metalization layer 160, preferably comprised of aluminum, is insulated from substrate 114 by an oxide layer 162. A film of refractory metal disilicide 164 is formed on the surfaces of the source/drain regions 120 and 122, on the channel stoppers 124 and 126, and elsewhere, as shown in FIGS. 4 and 5.

In FIG. 6, resistor 132 comprises an aluminum wire 140 in electrical contact with channel stopper 126 via a contact hole 142 and all of which are connected to the power supply potential $V_{dd}$. A second contact region 136 is heavily doped with an n-type impurity formed in substrate 114 apart from contact hole 142. An aluminum wire 134 connects contact region 136, via a contact hole 137, to gate electrode 116. The body of the bulk resistance of resistor 132 is substantially comprised of a local, unbounded region of the substrate 114 that is squeezed into the space between channel stopper 126 and contact region 136.

Similarly, in FIG. 7 resistor 144 comprises an aluminum wire 150 in electrical contact with channel stopper 124 via a contact hole 152, all of which are connected the ground potential $V_{SS}$. A contact region 148, which is heavily doped with a p-type impurity in well 112, is formed at a position away from contact hole 152. An aluminum wire 146 connects the contact region 148, via a contact hole 149, to the gate electrode 118. The body of the bulk resistance of resistor 144 is substantially comprised of a local, unbounded region of the substrate 114 that is squeezed into the space between channel stopper 124 and contact region 148.

The diffusion regions have surfaces formed with refractory metal disilicide film 164. The surfaces of substrate 114 and well 112 are not covered with film 164, therefore, the impurity contents of substrate 114 and well 112 will be lower than that of channel stoppers 124 and 126. Because of this, resistors 132 and 144 will naturally have relatively large resistance values. Resistors 132 and 144 are then better able to protect gate insulation film 121 from breakdown due to power turn-on noise or surge voltages. The position at which contact regions 136 and 148 are formed can be selected with relative freedom. Since contact regions 136 and 148 are small and the resistance bulk comprise local regions of the substrate 114 and the well 112, it becomes possible to use what would otherwise be wasted space. When fabricating IC 110, contact regions 136 and 148, channel stoppers 124 and 126, and source/drain 120 and 122 may be formed at the same time. Therefore only the mask pattern would need to be modified to implement the present invention in a prior art device.

A second embodiment of the integrated circuit having an MIS transistor of the present invention is illustrated in FIGS. 8-10. In FIG. 8A, a device 210 comprises a transistor 230 with a gate electrode 216 that is pulled-down to ground potential $V_{SS}$ through a protective resistor 232. A transistor 228 has a gate electrode 218 that is pulled-up to power supply potential $V_{dd}$ through a protective resistor 244. (Roughly the opposite to the situation in device 110.) FIGS. 8B and 8C illustrate respectively the schematics of resistors 232 and 244. As shown in FIGS. 8A and 9, resistor 232 comprises an aluminum wire 250 in electrical contact with a channel stopper 224, via a contact hole 252, all of which are connected to the ground potential $V_{SS}$. A contact region 238 is heavily doped with a p-type impurity and formed in the well 212 at a position isolated from contact hole 252. An aluminum wire 234 connects contact region 238 via a contact hole 237 to gate electrode 216. The resistance region of resistor 232, is substantially a local, unbounded region in well 212 and is squeezed between channel stopper 224 and contact region 238.

Similarly, as shown in FIGS. 8A and 10 resistor 244 comprises an aluminum wire 240 connected to a channel stopper 226 via a contact hole 242, all of which are connected to the power supply potential $V_{dd}$. A contact region 248, which is heavily doped with an n-type impurity, is formed in substrate 214 at a position remote from contact hole 242, An aluminum wire 246 connects contact region 248 via a contact hole 249 to gate electrode 218. The resistance region of resistor 244 is substantially a local, unbounded region of the substrate 214 sandwiched between channel stopper 226 and the contact region 248.

As with the first embodiment, fabricating the gate input protective resistors 232 and 244 takes advantage of the fact that the impurity contents of the substrate 214 and the well 212 are low, the fact that the IC is fabricated uses a self-aligned silicide process notwithstanding. Since high resistance values can be easily realized for resistors 232 and 244, the gate insulation film can be effectively protected from breakdown voltages.

As should be apparent from the above, the present invention relates to an integrated circuit in which the gate electrode of an MIS transistor is connected to power supply potentials through protective resistors and applies specifically to ICs in which the resistors are not made as diffusion resistors formed as diffusion region islands within the semiconductor substrate or the well. Instead, resistors in the present invention are comprised by unbounded local regions within the semiconductor substrate or the well.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. In a self-aligned I C manufacturing process that includes a self-aligned silicide process for depositing a layer of refractory metal silicide, a method for manufacturing a high impedance circuit for protecting inputs of metal-insulator-semiconductor (MIS) transistors, the method comprising the steps of:

defining a body of a resistor to comprise a portion of a lightly doped volume of a semiconductor substrate, with the surface of the portion of the substrate uncovered by the layer of refractory metal silicide;

defining a first terminal of the resistor to comprise a portion of a heavily doped channel stopper for coupling to a power supply potential;

defining a second terminal of the resistor to comprise a heavily doped contact region within the substrate apart from the portion of the channel stopper for coupling to a gate input of a MIS transistor.

2. The method of claim 1, wherein the defining of the body of the resistor includes defining the body of the resistor to comprise a region of the lightly doped volume between the portion of the channel stopper and the contact region.

3. The method of claim 2, wherein the region of the lightly doped volume is an unbounded region.

4. The method of claim 3, wherein the defining of the second terminal includes defining the contact region on the substrate surface.

5. The method of claim 3, wherein the defining of the second terminal includes defining the contact region on the surface of a doped well in the substrate.

6. The method of claim 3, further comprising coupling of the first terminal to a positive power supply potential $V_{dd}$ so that the resistor constitutes a pull-up resistor.

7. The method of claim 3, further comprising coupling of the first terminal to a negative power supply potential $V_{SS}$ so that the resistor constitutes a pull-down resistor.

8. The method of claim 3, further comprising positioning the resistor and an associated MIS transistor to minimize the surface area of the substrate occupied, so that more circuits are fabricated on a given surface area of the substrate.

9. In a self-aligned IC manufacturing process that includes a self-aligned silicide process for depositing a layer of refractory metal silicide, a method for manufacturing a high impedance circuit for protecting active circuit components, the method comprising the steps of;

defining a body of a resistor to comprise a portion of a lightly doped volume of a semiconductor substrate, with the surface of the portion of the substrate uncovered by the layer of refractory metal silicide;

defining a first terminal of the resistor to comprise a portion of a heavily doped channel stopper for coupling to a power supply potential; and defining a second terminal of the resistor to comprise a heavily doped contact region within the substrate apart from the portion of the channel stopper for coupling to an active circuit component.

10. The method of claim 9, wherein the defining of the body of the resistor includes defining the body of the resistor to comprise a region of the lightly doped volume between the portion of the channel stopper and the contact region.

11. The method of claim 10, wherein the region of the lightly doped volume is an unbounded region.

12. The method of claim 11, wherein the defining of the second terminal includes defining the contact region on the substrate surface.

13. The method of claim 11, wherein the defining of the second terminal includes defining the contact region on the surface of a doped well in the substrate.

14. The method of claim 11, further comprising coupling the first terminal to a positive power supply potential $V_{dd}$ so that the resistor constitutes a pull-up resistor.

15. The method of claim 11, further comprising coupling the first terminal to a negative power supply potential $V_{SS}$ so that the resistor constitutes a pull-down resistor.

16. The method of claim 11, further comprising positioning the resistor and an associated active circuit component to minimize the surface area of the substrate occupied, so that more circuits are fabricated on a given surface area of the substrate.

* * * * *